(12) United States Patent
Lu et al.

(10) Patent No.: US 11,489,054 B2
(45) Date of Patent: *Nov. 1, 2022

(54) RAISED EPITAXIAL LDD IN MUGFETS AND METHODS FOR FORMING THE SAME

(71) Applicant: Taiwan Semiconductor Manufacturing Co., Ltd., Hsinchu (TW)

(72) Inventors: Yong-Yan Lu, Hsinchu (TW); Hou-Yu Chen, Zhubei (TW); Shyh-Horng Yang, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/099,127

(22) Filed: Nov. 16, 2020

(65) Prior Publication Data

US 2021/0083063 A1   Mar. 18, 2021

Related U.S. Application Data

(60) Continuation of application No. 16/568,847, filed on Sep. 12, 2019, now Pat. No. 10,840,346, which is a
(Continued)

(51) Int. Cl.
*H01L 29/94* (2006.01)
*H01L 29/76* (2006.01)
(Continued)

(52) U.S. Cl.
CPC ........ *H01L 29/41791* (2013.01); *H01L 29/04* (2013.01); *H01L 29/045* (2013.01);
(Continued)

(58) Field of Classification Search
CPC . H01L 29/41791; H01L 29/04; H01L 29/045; H01L 29/0649; H01L 29/0847;
(Continued)

(56) References Cited

U.S. PATENT DOCUMENTS 6,815,770 B1    11/2004  Chien et al.
9,941,368 B2 *   4/2018  Lu ..................... H01L 29/66553
(Continued)

*Primary Examiner* — Theresa T Doan
(74) *Attorney, Agent, or Firm* — Slater Matsil, LLP

(57) ABSTRACT

Embodiments include Multiple Gate Field-Effect Transistors (MuGFETs) and methods of forming them. In an embodiment, a structure includes a substrate, a fin, masking dielectric layer portions, and a raised epitaxial lightly doped source/drain (LDD) region. The substrate includes the fin. The masking dielectric layer portions are along sidewalls of the fin. An upper portion of the fin protrudes from the masking dielectric layer portions. A first spacer is along a sidewall of a gate structure over a channel region of the fin. A second spacer is along the first spacer. The raised epitaxial LDD region is on the upper portion of the fin, and the raised epitaxial LDD region adjoins a sidewall of the first spacer and is disposed under the second spacer. The raised epitaxial LDD region extends from the upper portion of the fin in at least two laterally opposed directions and a vertical direction.

20 Claims, 7 Drawing Sheets

Related U.S. Application Data division of application No. 15/944,375, filed on Apr. 3, 2018, now Pat. No. 10,516,024, which is a continuation of application No. 15/367,020, filed on Dec. 1, 2016, now Pat. No. 9,941,368, which is a continuation of application No. 14/865,678, filed on Sep. 25, 2015, now Pat. No. 9,515,167, which is a division of application No. 14/040,161, filed on Sep. 27, 2013, now Pat. No. 9,166,044.

(51) Int. Cl.
| | | |
|---|---|---|
| *H01L 29/417* | (2006.01) | |
| *H01L 29/78* | (2006.01) | |
| *H01L 29/66* | (2006.01) | |
| *H01L 29/04* | (2006.01) | |
| *H01L 29/06* | (2006.01) | |
| *H01L 29/08* | (2006.01) | |

(52) U.S. Cl.
CPC ...... *H01L 29/0649* (2013.01); *H01L 29/0847* (2013.01); *H01L 29/41783* (2013.01); *H01L 29/6656* (2013.01); *H01L 29/6659* (2013.01); *H01L 29/66553* (2013.01); *H01L 29/66636* (2013.01); *H01L 29/66795* (2013.01); *H01L 29/785* (2013.01); *H01L 29/7833* (2013.01); *H01L 29/7834* (2013.01); *H01L 29/7853* (2013.01); *H01L 29/7854* (2013.01)

(58) Field of Classification Search
CPC ......... H01L 29/41783; H01L 29/66553; H01L 29/6656; H01L 29/6659; H01L 29/66636; H01L 29/66795; H01L 29/7833; H01L 29/785; H01L 29/7834; H01L 29/7853; H01L 29/7854
USPC ...................................................... 257/344
See application file for complete search history.

(56) References Cited

U.S. PATENT DOCUMENTS

| | | |
|---|---|---|
| 2011/0024840 A1 | 2/2011 | Khater |
| 2011/0042744 A1 | 2/2011 | Cheng et al. |
| 2011/0223736 A1 | 9/2011 | Lin et al. |
| 2013/0075818 A1 | 3/2013 | Lee et al. |
| 2013/0277686 A1 | 10/2013 | Liu et al. |
| 2013/0285129 A1 | 10/2013 | Jensen et al. |
| 2014/0027816 A1 | 1/2014 | Cea et al. |
| 2014/0183663 A1 | 7/2014 | Song et al. |
| 2015/0024561 A1 | 1/2015 | Li et al. |

* cited by examiner

RAISED EPITAXIAL LDD IN MUGFETS AND METHODS FOR FORMING THE SAME

PRIORITY CLAIM AND CROSS-REFERENCE

This application is a continuation of U.S. patent application Ser. No. 16/568,847, filed on Sep. 12, 2019, entitled "Raised Epitaxial LDD in MuGFETs and Methods for Forming the Same," which is a division of U.S. patent application Ser. No. 15/944,375, filed on Apr. 3, 2018, entitled "Raised Epitaxial LDD in MuGFETs and Methods for Forming the Same," now U.S. Pat. No. 10,516,024, issued Dec. 24, 2019, which is a continuation of U.S. patent application Ser. No. 15/367,020, filed on Dec. 1, 2016, (now U.S. Pat. No. 9,941,368, issued Apr. 10, 2018) entitled "Raised Epitaxial LDD in MuGFETs and Methods for Forming the Same," which is a continuation of U.S. patent application Ser. No. 14/865,678, filed on Sep. 25, 2015, (now U.S. Pat. No. 9,515,167, issued Dec. 6, 2016) entitled "Raised Epitaxial LDD in MuGFETs and Methods for Forming the Same," which is a division of U.S. patent application Ser. No. 14/040,161, filed on Sep. 27, 2013, (now U.S. Pat. No. 9,166,044, issued Oct. 20, 2015) entitled "Raised Epitaxial LDD in MuGFETs," which applications are hereby incorporated herein by reference in their entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Multiple Gate FETs (MuGFETs), which include Fin FETs (finFETs), have been studied to overcome some of these problems.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Multiple Gate Field-Effect Transistors (MuGFETs), which include Fin FETs (finFETs), and methods of forming the same are provided in accordance with various embodiments. The intermediate stages of forming the MuGFETs are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein. For example, some embodiments are discussed herein in the context of a gate-first process, whereas other embodiments contemplate a gate-last process.

Figure 1:
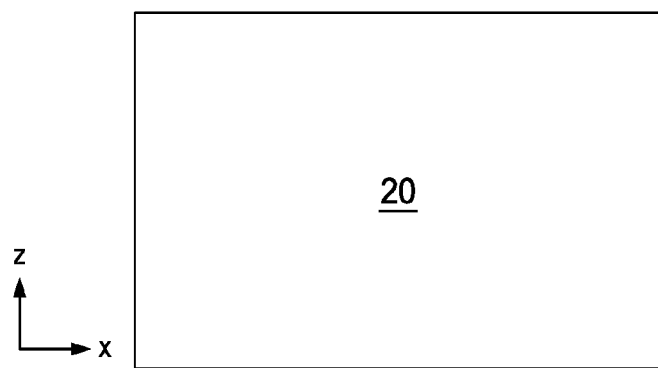
FIGS. 1 through 5 illustrate a method of forming a fin and a gate structure according to an embodiment.
Figure 3:
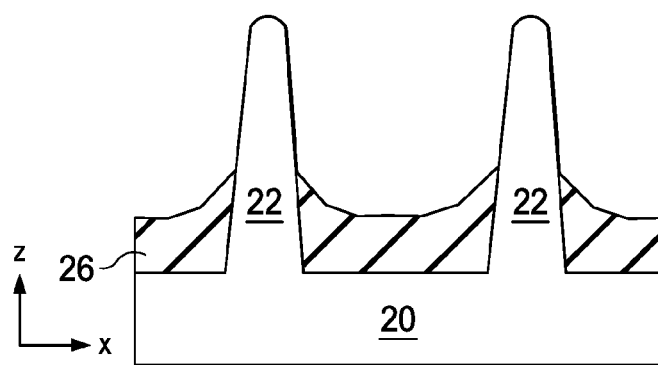
Figure 4:
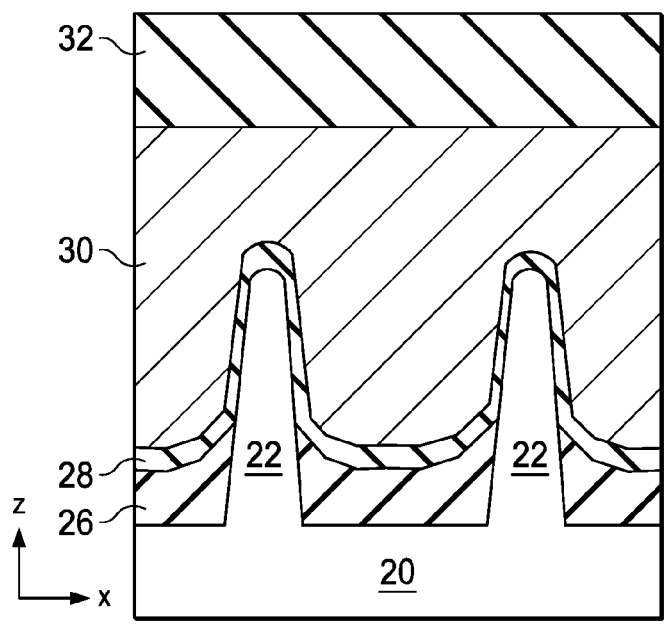
Figure 5:
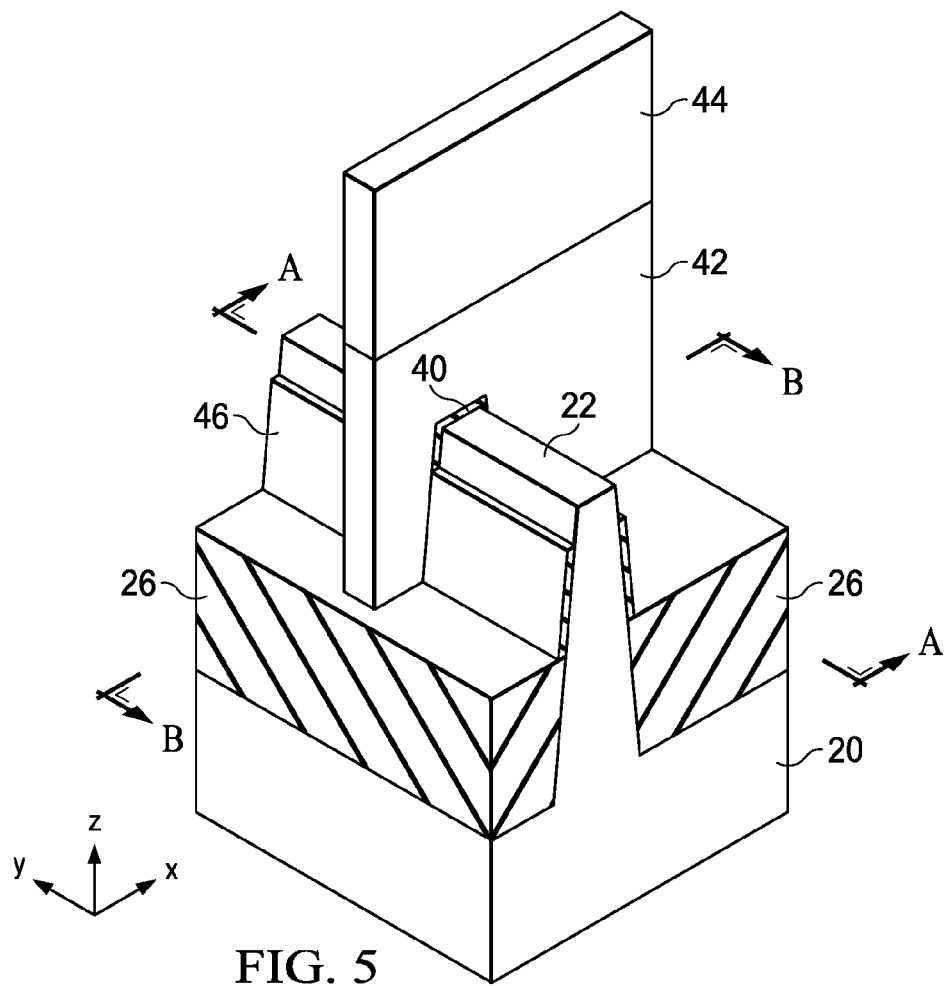

FIGS. 1 through 5 illustrate an example method of forming a fin and a gate structure for a MuGFET. FIGS. 1 through 4 are cross sections along an X-Z plane, and FIG. 5 is a three dimensional view. FIG. 1 illustrates a substrate 20, which may be, e.g., a part of a wafer. Substrate 20 may be a semiconductor substrate, which may further be a silicon substrate, a silicon carbon substrate, a silicon germanium substrate, or a substrate formed of other semiconductor materials. The substrate 20 may be a bulk substrate, a semiconductor-on-insulator (SOI) substrate, or other acceptable substrates. The substrate 20 may be lightly doped with a p-type or an n-type impurity.

Figure 2:
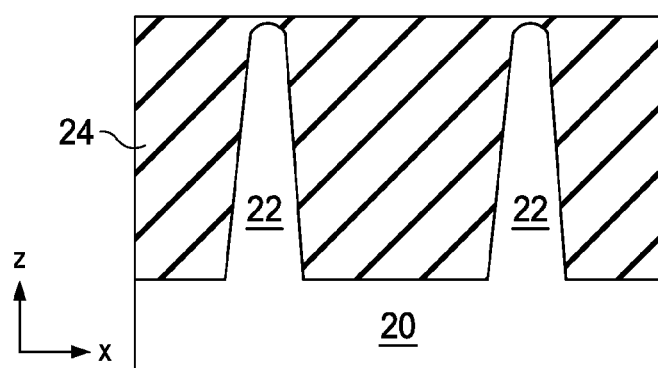

FIGS. 2 and 3 illustrate the formation of fins 22 and isolation regions 26 between the fins 22. In FIG. 2, the fins 22 are formed in the substrate 20, and a dielectric material 24 is formed between the fins 22. In some embodiments, the fins 22 may be formed in the substrate 20 by etching trenches in the substrate 20. The etching may be any acceptable etch process, such as a reactive ion etch (RIE), neutral beam etch (NBE), the like, or a combination thereof. The dielectric material 24 may be a high density plasma oxide, such as silicon oxide, formed by a high density plasma chemical vapor deposition (CVD) or a flowable CVD (FCVD), such as formed by a CVD-based material deposition in a remote plasma system and post curing to make it convert to oxide. Other dielectric materials formed by any acceptable process may be used. A planarization process, such as a chemical mechanical polish (CMP), may remove any excess dielectric material 24 and form top surfaces of the dielectric material 24 and top surfaces of the fins 22 that are co-planar.

In FIG. 3, the dielectric material 24 is recessed to form isolation regions 26, which may also be referred to as Shallow Trench Isolation (STI) regions. In FIG. 3, the isolation regions 26 are recessed such that fins 22 protrude from between neighboring isolation regions 26. The isolation regions 26 may be recessed using an acceptable etching process, such as one that is selective to the material of the isolation regions 26. For example, a chemical oxide removal using a Tokyo Electron CERTAS or an Applied Materials SICONI tool or dilute hydrofluoric acid may be used.

A person having ordinary skill in the art will readily understand that the process described with respect to FIGS. 2 and 3 is just one example of how fins 22 may be formed. In other embodiments, a dielectric layer can be formed over a top surface of the substrate 20; trenches can be etched through the dielectric layer; homo-epitaxial structures can be epitaxially grown in the trenches; and the dielectric layer can be recessed such that the homo-epitaxial structures protrude from the dielectric layer to form fins.

In still other embodiments, heteroepitaxial structures can be used for the fins. For example, the fins 22 in FIG. 2 can be recessed, and a material different from the fins 22 may be epitaxially grown in their place. In an even further embodiment, a dielectric layer can be formed over a top surface of the substrate 20; trenches can be etched through the dielectric layer; heteroepitaxial structures can be epitaxially grown in the trenches using a material different from the substrate 20; and the dielectric layer can be recessed such that the heteroepitaxial structures protrude from the dielectric layer to form fins.

In some embodiments where homo-epitaxial or heteroepitaxial structures are epitaxially grown, the grown materials may be in situ doped during growth, which may obviate some implantations although in situ and implantation doping may be used together. Still further, it may be advantageous to epitaxially grow a material in an NFET region different from the material in a PFET region. In various embodiments, the fins 22 may comprise or consist essentially of silicon, silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A person of ordinary skill in the art will readily understand other methods of forming the fins, which are contemplated within the scope of some embodiments.

Although not depicted, a P well and/or an N well may be formed in various regions of the fins 22 and/or substrate 20. For example, during the processing discussed with respect to FIGS. 2 and 3, a photoresist can be formed over the fins 22 and the dielectric material 24 or the isolation regions 26. The photoresist can be patterned to expose a region of the substrate 20, such as an NFET region, by using a spin-on technique and acceptable photolithography techniques. Once patterned, a p-type impurity implant may be performed in the NFET region. The p-type impurities may be boron, $BF_2$, or the like implanted in the NFET region to a concentration of equal to or less than $7 \times 10^{18}$ cm$^{-3}$, such as between about $10^{15}$ cm$^{-3}$ and about $7 \times 10^{18}$ cm$^{-3}$. After the implant, the photoresist may be removed, such as by an acceptable ashing process. Another photoresist may be patterned to expose another region of the substrate 20, such as a PFET region, using similar techniques, and an n-type impurity implant may be performed in the PFET region. The n-type impurities may be phosphorus, arsenic, or the like implanted in the PFET region to a concentration of equal to or less than $7 \times 10^{18}$ cm$^{-3}$, such as between about $10^{15}$ cm$^{-3}$ and about $7 \times 10^{18}$ cm$^{-3}$. After the implant, the photoresist may be removed, such as by an acceptable ashing process. After the implants, an anneal may be performed to activate the p-type and n-type impurities that were implanted. The implantations may form a p-well in the NFET region and an n-well in the PFET region.

FIG. 4 illustrates a gate dielectric layer 28 formed over the fins 22 and the isolation regions 26, a gate electrode layer 30 over the gate dielectric layer 28, and a mask layer 32 over the gate electrode layer 30. In some embodiments, gate dielectric layer 28 comprises silicon oxide, silicon nitride, or multilayers thereof. In other embodiments, gate dielectric layer 28 comprises a high-k dielectric material, and in these embodiments, gate dielectric layer 28 may have a k value greater than about 7.0, and may include a metal oxide or a silicate of Hf, Al, Zr, La, Mg, Ba, Ti, Pb, and combinations thereof. The formation methods of gate dielectric layer 28 may include Molecular-Beam Deposition (MBD), Atomic Layer Deposition (ALD), Plasma Enhanced Chemical Vapor Deposition (PECVD), thermal oxidation, and the like. The gate electrode layer 30 may comprise polysilicon (doped or undoped), a metal-containing material such as TiN, TaN, TaC, Co, Ru, Al, combinations thereof, or multi-layers thereof. The gate electrode layer 30 may be deposited using CVD, ALD, physical vapor deposition (PVD), the like, or a combination thereof. The mask layer 32 may comprise silicon nitride, silicon oxide, silicon oxynitride, the like, or a combination thereof, and may be deposited using CVD, ALD, PVD, the like, or a combination thereof.

FIG. 5 illustrates an example of an intermediate MuGFET in a three-dimensional view. In FIG. 5, the mask layer 32, the gate electrode layer 30, and the gate dielectric layer 28 are patterned to form a mask 44, a gate electrode 42, and a gate dielectric 40, respectively. The patterning may use an acceptable photolithography and etch process(es), such as an RIE, CCP, ICP, the like, or a combination thereof. The etch may be selective to a desired material and may be anisotropic. The gate dielectric layer 28 may be removed from top surfaces of the fins 22, but remaining masking portions 46 of the gate dielectric layer 28 may remain on sidewalls of the fin 22 due to the etch being anisotropic. The remaining masking portions 46 may be exposed on the side of the fin 22. The remaining masking portions 46 on the sidewalls of the fin 22 may expose an upper portion of the fin 22, such as to a distance of approximately 2 nm to 10 nm from the top surface of the fin 22. This upper portion exposure may result from the etch that patterns the gate electrode 42 and/or gate dielectric 40, or by a subsequent etch.

FIG. 5 further illustrates various cross sections used for reference in other figures. Cross section A-A is in a Y-Z plane and is illustrated as a reference for FIGS. 6A, 7A, 8A, 9A, 10A, and 11A. Cross section B-B is in an X-Z plane and is illustrated as a reference for FIGS. 6B, 7B, 8B, 9B, 10B, and 11B. Further, cross section B-B may be a reference plane for the cross sections in FIGS. 1 through 4, although any X-Z plane may be illustrated in those figures.

Figure 6A:
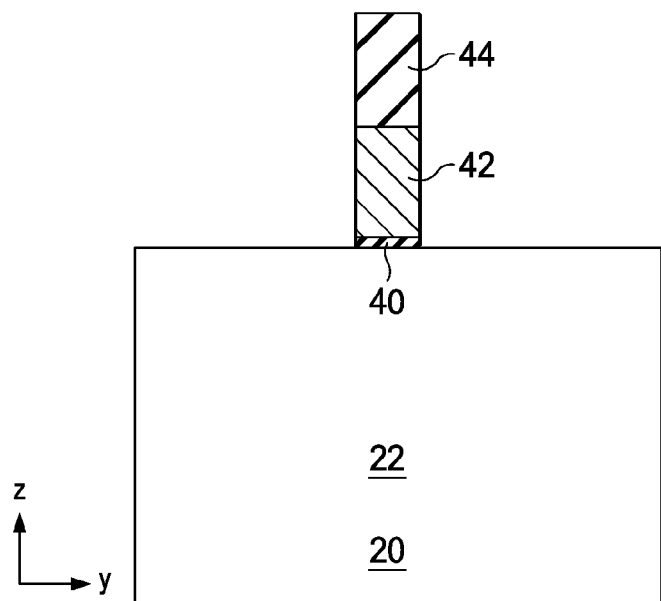
FIGS. 6A, 6B, 7A, 7B, 8A, 8B, 9A, 9B, 10A, 10B, 11A, 11B, and 11C are cross-sectional views of intermediate stages in the manufacturing of a MuGFET in accordance with an embodiment.
Figure 6B:
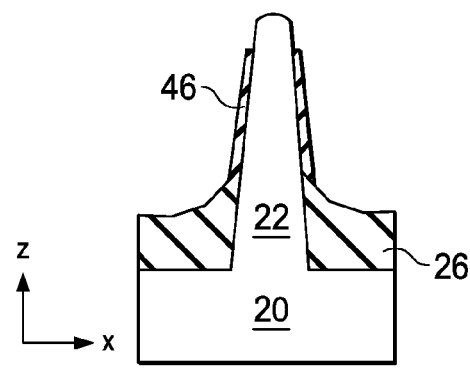

FIGS. 6A and 6B illustrate respective cross sections of the intermediate MuGFET of FIG. 5. FIG. 6A illustrates the substrate 20 including the fin 22, a gate dielectric 40 over a channel region of the fin 22, a gate electrode 42 over the gate dielectric 40, and the mask 44 over the gate electrode 42. FIG. 6B illustrates the substrate 20 including the fin 22, the isolation regions 26 adjacent the fin 22, and the remaining masking portions 46 on sidewalls of the fin 22.

Figure 7A:
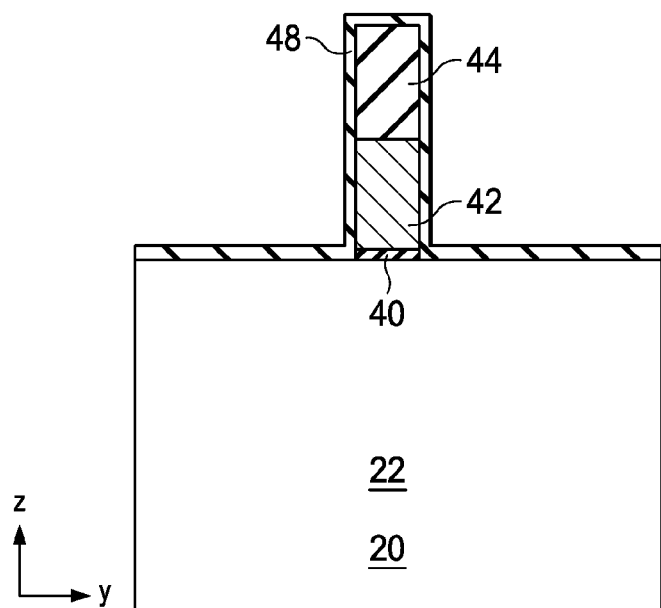
Figure 7B:
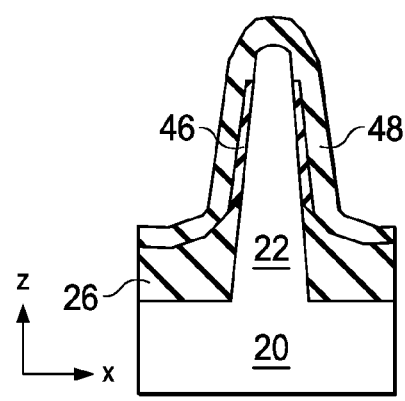

In FIGS. 7A and 7B, an offset spacer layer 48 is conformally deposited over the intermediate MuGFET structure in FIGS. 5, 6A, and 6B. The offset spacer layer 48 may be silicon nitride (SiN), silicon carbon-nitride (SiCN), silicon carbon-oxynitride (SiCON), the like, or a combination thereof, formed by CVD, ALD, the like, or a combination thereof.

Figure 8A:
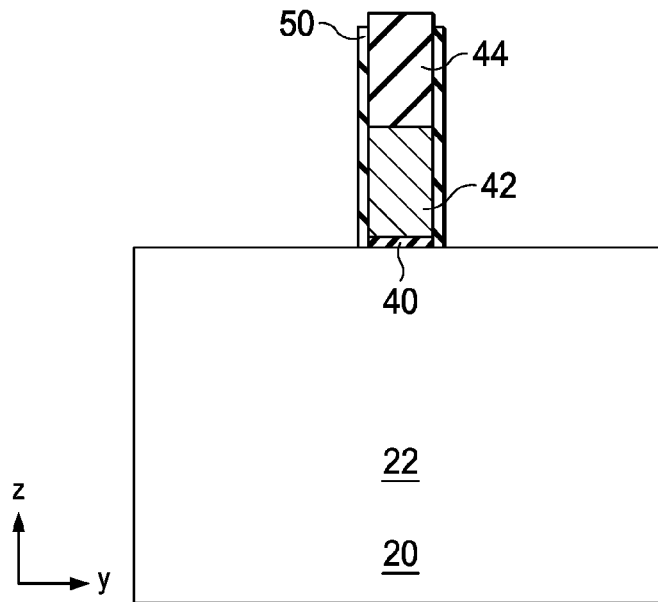
Figure 8B:
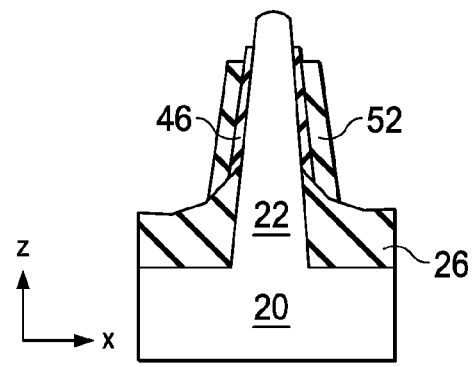

In FIGS. 8A and 8B, the offset spacer layer 48 is anisotropically etched to form offset spacers 50 on sidewalls of the gate structure, e.g., at least adjoining the gate dielectric 40 and gate electrode 42. Also as a result of this etch, remaining offset portions 52 remain on sidewalls of the fin 22. The etch may be an RIE, CCP, ICP, transformer coupled plasma (TCP), a high density plasma (HDP) etch, electron cyclotron resonance (ECR) etch, the like, or a combination thereof. The remaining offset portions 52 on the sidewalls of the fin 22 may expose an upper portion of the fin 22, for example, the etch may remove a portion of the offset spacer layer 48 from a distance of approximately 2 nm to 10 nm from the top surface of the fin 22.

Figure 9A:
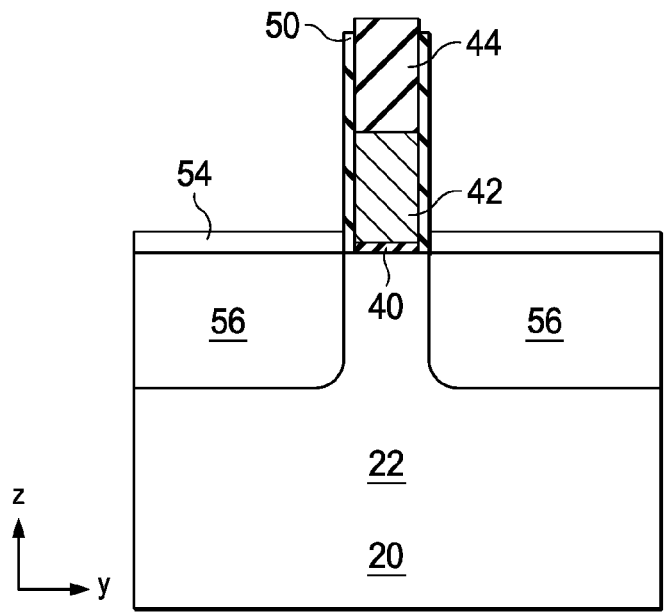
Figure 9B:
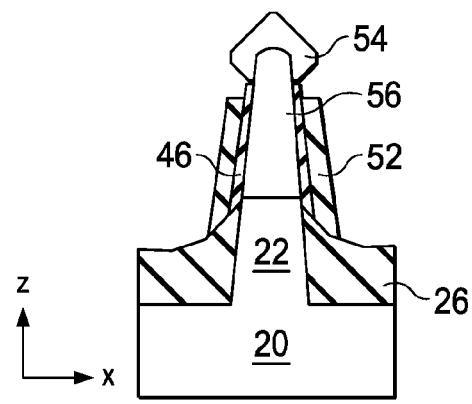

In FIGS. 9A and 9B, a raised epitaxial layer 54 is epitaxially grown on exposed surfaces of the fin 22, and the raised epitaxial layer 54 and portions of the fin 22 are implanted with dopants to form lightly doped source/drain (LDD) regions 56, which may also be referred to as source/drain extension regions. The raised epitaxial layer 54 may comprise or consist essentially of silicon, silicon germanium, germanium, silicon carbide, indium phosphide (InP), gallium arsenide (GaAs), the like, or a combination thereof. The epitaxial growth may be performed using metal-organic CVD (MOCVD), molecular beam epitaxy (MBE), liquid phase epitaxy (LPE), vapor phase epitaxy (VPE), selective epitaxial growth (SEG), the like, or a combination thereof. The remaining masking portions 46, remaining offset portions 52, or a combination thereof may mask lower portions of the fin 22 to prevent epitaxial growth from occurring on those lower portions of the fins 22. A thickness T (see for example, FIGS. 12C and 13C) of the epitaxial layer 54 measured in a direction perpendicular from a corresponding surface of the fin 22 may be between approximately 2 nm and 10 nm, although the thickness may vary depending on the technology node, for example. The LDD regions 56 may be implanted to a dopant concentration of equal to or greater than $10^{19}$ cm$^{-3}$. The dopants may include, for example, boron, indium, or the like for a p-type transistor, and may include, for example, phosphorus, arsenic, or the like for an n-type transistor.

Figure 10A:
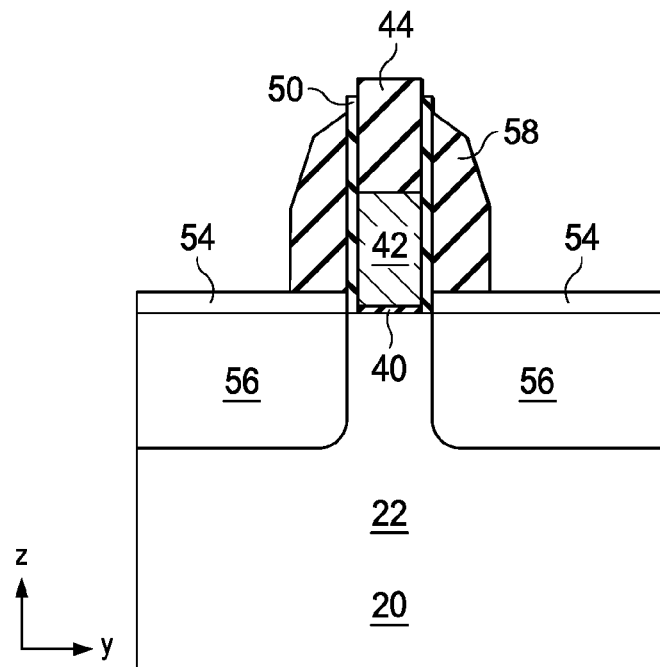
Figure 10B:
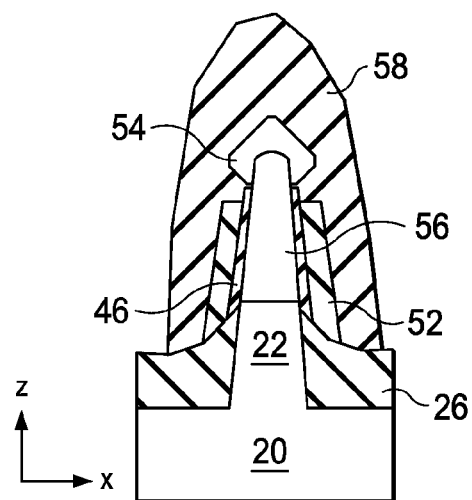

In FIGS. 10A and 10B, main spacers 58 are formed along sidewalls of the offset spacers 50 and over portions of the epitaxial layer 54. The main spacers 58 may be formed by depositing a main spacer layer and anisotropically etching the main spacer layer. The main spacer layer may be silicon nitride (SiN), silicon carbon-nitride (SiCN), silicon carbon-oxynitride (SiCON), the like, or a combination thereof, formed by CVD, ALD, MOCVD, the like, or a combination thereof. The etch may be an RIE, CCP, ICP, TCP, HDP etch, ECR, the like, or a combination thereof.

Figure 11A:
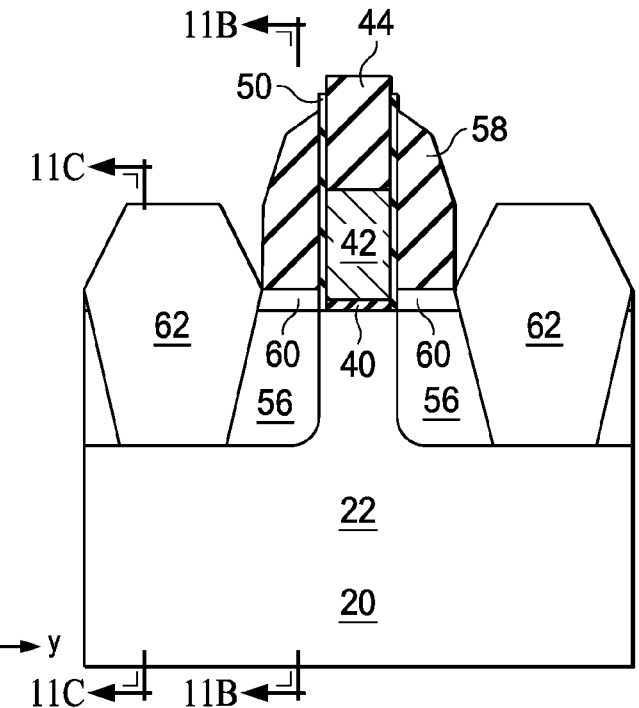
Figure 11B:
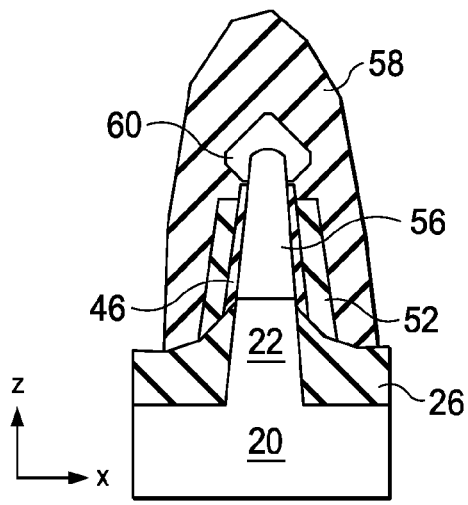
Figure 11C:
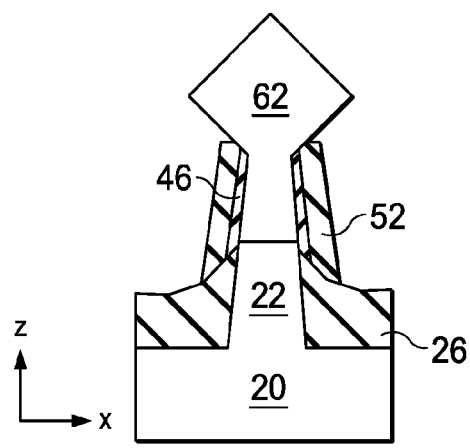

In FIGS. 11A, 11B, and 11C, the fin 22 is etched to recess source/drain areas of the fin 22, and raised epitaxial source/drain regions 62 are epitaxially grown. The etch may be selective to exposed portions of the raised epitaxial layer 54 and the fin 22, and the remaining masking portions 46, remaining offset portions 52, the mask 44, offset spacers 50, and main spacers 58 may act as a mask to prevent etching in other portions of the fin 22. The raised epitaxial source/drain regions 62 may comprise or consist essentially of silicon, silicon germanium, germanium, silicon carbide, indium phosphide (InP), gallium arsenide (GaAs), the like, or a combination thereof, and may be epitaxially grown using MOCVD, MBE, LPE, VPE, SEG, the like, or a combination thereof. The raised epitaxial source/drain regions 62 extend or protrude from an original surface of the fin 22. The raised epitaxial source/drain regions 62 may further be doped to a concentration of greater than or equal to $5\times10^{19}$ cm$^{-3}$ by in situ doping during growth and/or subsequent implantation. The dopants may include, for example, boron, indium, or the like for a p-type transistor, and may include, for example, phosphorus, arsenic, or the like for an n-type transistor.

As illustrated in FIGS. 11A, 11B, and 11C, the etch to form the raised epitaxial source/drain regions 62 removes exposed portions of the raised epitaxial layer 54. Hence, as illustrated, the portions of the raised epitaxial layer 54 under the main spacers 58 remain and form raised epitaxial LDD regions 60. FIG. 11B, which shows the cross section B-B, illustrates the raised epitaxial LDD region 60 under the main spacer 58, and FIG. 11C, which illustrates the cross section C-C, shows the raised epitaxial source/drain regions 62 where the raised epitaxial layer 54 was removed.

Figure 12A:
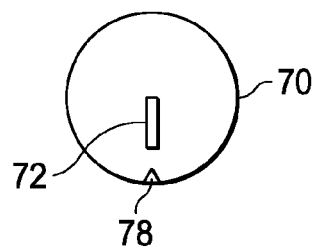
FIGS. 12A, 12B, and 12C are example structures used in manufacturing a MuGFET according to an embodiment.
Figure 13A:
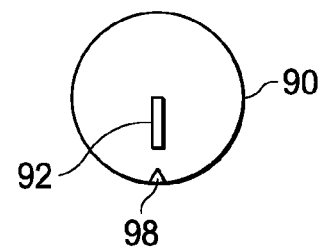
FIGS. 13A, 13B, and 13C are further example structures used in manufacturing a MuGFET according to an embodiment.
Figure 12B:
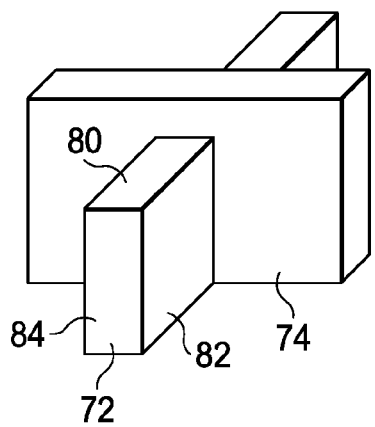
Figure 13B:
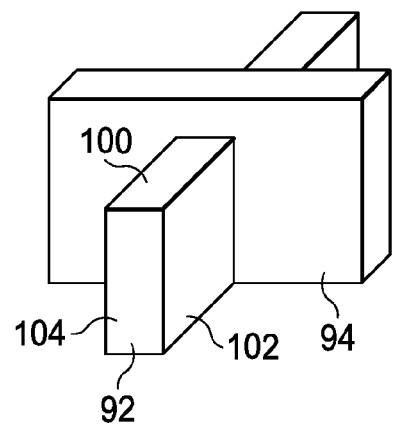
Figure 12C:
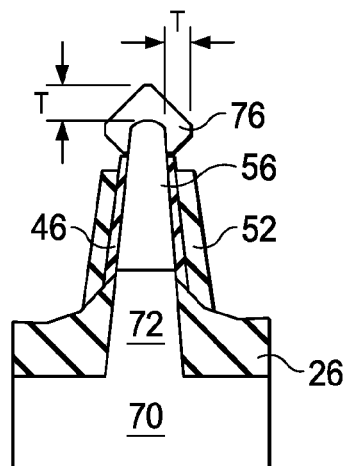
Figure 13C:
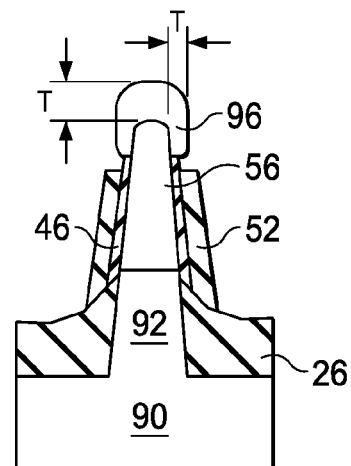

The crystalline structure upon which raised epitaxial layer 54 is grown may affect the shape of the raised epitaxial layer 54, and hence, the raised epitaxial LDD regions 60. FIGS. 12A-C and 13A-C illustrate some example conditions. FIG. 12A illustrates a substrate 70, e.g., a wafer having a (001) Si surface, and a notch 78 in the <110>direction. A fin 72 is on the substrate 70. In FIG. 12B, the fin 72 comprises a (001) Si top surface 80, a (110) Si sidewall surface 82, and a (110) Si end surface 84. A gate structure 74, such as including gate dielectric 40, gate electrode 42, and mask 44 is over a channel region of the fin 72. With these surfaces, a faceted raised epitaxial layer 76 with (111) surfaces may be grown on the fin 72. This may result because of the starting epitaxy crystalline surface orientation. FIG. 13A illustrates a substrate 90, e.g., a wafer having a (001) Si surface, and a notch 98 in the <100>direction. A fin 92 is on the substrate 90. In FIG. 13B, the fin 92 comprises a (001) Si top surface 100, a (010) Si sidewall surface 102, and a (100) Si end surface 104. A gate structure 94, such as including gate dielectric 40, gate electrode 42, and mask 44 is over a channel region of the fin 92. With these surfaces, a conformal raised epitaxial layer 96 may be grown on the fin 92. This may result because of the starting epitaxy crystalline surface orientation. FIGS. 12C and 13C further illustrate example thicknesses T, which may be between approximately 2 nm and 10 nm, although other thicknesses may be used, especially for differing technology nodes.

Embodiments may achieve advantages. As shown in the figures, some embodiments may employ a raised epitaxial LDD region on an upper portion of the fin. This raised epitaxial LDD region is grown in three directions, e.g., two opposite lateral directions from the fin and a vertical direction from the fin. This shape may reduce parasitic resistance in a MuGFET by reducing a current density through the LDD region. Further, since only the upper portion of the fin has the raised epitaxial LDD region and not on all of the fin sidewall, short channel effect advantages may remain in the MuGFET. The raised epitaxial LDD region may also enhance carrier mobility through the MuGFET.

In an embodiment, a structure include: a substrate including a fin; a gate structure over a channel region of the fin; a gate spacer along a sidewall of the gate structure; a raised epitaxial lightly doped source/drain (LDD) region on a first portion of the fin, the raised epitaxial LDD region being disposed between the gate spacer and the first portion of the fin, a top surface of the raised epitaxial LDD region being higher than a topmost surface of the first portion of the fin; and a raised epitaxial source/drain region adjacent the gate spacer and extending beyond a surface of the fin, a top surface of the raised epitaxial source/drain region being higher than the top surface of the raised epitaxial LDD region.

In some embodiments, the structure further includes: isolation regions adjoining first and second sidewalls of the fin, the first portion of the fin protruding from the isolation regions. In some embodiments of the structure, the substrate is a (001) Si substrate, and the first and second sidewalls of the fin are (110) Si surfaces. In some embodiments of the structure, the substrate is a (001) Si substrate, and the first and second sidewalls of the fin are (10) Si surfaces. In some embodiments of the structure, the raised epitaxial LDD region extends from the first and second sidewalls of the fin. In some embodiments, the structure further includes: a mask along a lower portion of a sidewall of the fin, the raised epitaxial LDD region being on an upper portion of the sidewall of the fin and the topmost surface of the fin. In some embodiments of the structure, the raised epitaxial LDD region has a faceted surface. In some embodiments of the structure, the faceted surface is a (111) surface. In some embodiments of the structure, the gate structure includes: a gate dielectric on the fin; and a gate electrode on the gate dielectric.

In an embodiment, a structure includes: a semiconductor fin extending from a substrate; isolation regions adjoining the semiconductor fin, a sidewall of the semiconductor fin protruding from the isolation regions; a mask on a lower portion of the sidewall of the semiconductor fin; a gate structure on a top surface of the semiconductor fin; a first lightly doped source/drain (LDD) region in the semiconductor fin; a gate spacer adjoining a sidewall of the gate structure and being disposed over the first LDD region; a second LDD region on the top surface of the semiconductor fin and an upper portion of the sidewall of the semiconductor fin, the second LDD region disposed between the gate spacer and the first LDD region, the second LDD region being a first raised epitaxial region; and a source/drain region adjacent the gate spacer proximate the second LDD region.

In some embodiments of the structure, the first raised epitaxial region has a facet with respect to an underlying surface of the semiconductor fin. In some embodiments of the structure, the facet is a (111) surface. In some embodiments of the structure, the source/drain region is a second raised epitaxial region and extends beyond a surface of the semiconductor fin. In some embodiments of the structure, the source/drain region has a top surface higher than a top surface of the second LDD region, and the second LDD region has a top surface higher than the first LDD region. In some embodiments of the structure, portions of the isolation regions are proximate the sidewall of the semiconductor fin, the substrate being a (001) Si substrate, the sidewall of the semiconductor fin being (110) Si surfaces. In some embodiments of the structure, the substrate is a (001) Si substrate, the sidewall of the semiconductor fin being (10) Si surfaces.

In an embodiment, a method includes: forming a fin extending from a substrate; forming an isolation region around the fin, sidewalls of the fin protruding above the isolation region; forming a first dielectric layer over the fin and the isolation region; forming a metal-containing layer over the first dielectric layer; patterning the metal-containing layer to form a gate electrode; patterning the a first dielectric layer to simultaneously form a gate dielectric and a mask, the mask being along lower portions of the sidewalls of the fin above the isolation region; growing a first epitaxial region on upper portions of the sidewalls of the fin and an upper surface of the fin, the first epitaxial region grown while the mask is along the lower portions of the sidewalls of the fin; forming a gate spacer adjacent the gate electrode and over the first epitaxial region; forming a recess in the fin; and growing a second epitaxial region in the recess.

In some embodiments of the method, the first epitaxial region is an epitaxial region having a faceted surface. In some embodiments of the method, the substrate is a (001) Si substrate, and sidewalls of the fin are (110) Si surfaces. In some embodiments of the method, the substrate is a (001) Si substrate, and sidewalls of the fin are (10) Si surfaces.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a fin extending from a substrate;
   a gate structure over a channel region of the fin;
   a first lightly doped source/drain (LDD) region in the fin;
   a first spacer over the first LDD region;
   a second LDD region between the first spacer and the first LDD region, the second LDD region and the first spacer being adjacent the gate structure, the second LDD region being a first raised epitaxial region; and
   a source/drain region adjacent the first spacer and the second LDD region, the source/drain region being a second raised epitaxial region.

2. The structure of claim 1, wherein the first raised epitaxial region has a facet with respect to an underlying surface of the fin.

3. The structure of claim 2, wherein the facet is a (111) surface.

4. The structure of claim 1, wherein the second raised epitaxial region extends beyond a surface of the fin.

5. The structure of claim 1, wherein the source/drain region has a top surface higher than a top surface of the second LDD region, and the second LDD region has a top surface higher than the first LDD region.

6. The structure of claim 1 further comprising:
   a second spacer between the gate structure and each of the second LDD region and the first spacer.

7. The structure of claim 1 further comprising:
   isolation regions adjoining the fin, a sidewall of the fin protruding from the isolation regions, the gate structure disposed on an upper portion of the sidewall of the fin; and
   a mask on a lower portion of the sidewall of the fin.

8. The structure of claim 7, wherein the substrate is a (001) Si substrate, the sidewall of the fin being a (110) Si surface.

9. The structure of claim 7, wherein the substrate is a (001) Si substrate, the sidewall of the fin being a (010) Si surface.

10. A structure comprising:
    a fin extending from a substrate;
    a gate structure on a top surface and sidewalls of the fin;
    an epitaxial lightly doped source/drain (LDD) region on the top surface and the sidewalls of the fin, the epitaxial LDD region having first faceted surfaces, the first faceted surfaces raised from the top surface and the sidewalls of the fin;
    an epitaxial source/drain region in the epitaxial LDD region and the fin, the epitaxial source/drain region having second faceted surfaces, the second faceted surfaces raised from the top surface and the sidewalls of the fin; and a first spacer between the epitaxial source/drain region and the gate structure, the first spacer disposed on the epitaxial LDD region.

11. The structure of claim 10 further comprising:
a second spacer between the gate structure and each of the epitaxial LDD region and the first spacer, the second spacer disposed on the fin.

12. The structure of claim 10 further comprising:
a source/drain extension region in the fin, the epitaxial LDD region disposed on the source/drain extension region.

13. The structure of claim 10 further comprising:
an isolation region adjoining the fin; and
a mask on the sidewalls of the fin, the mask extending from the isolation region to the epitaxial LDD region.

14. The structure of claim 13 further comprising:
a second spacer on a sidewall of the mask.

15. The structure of claim 10, wherein the second faceted surfaces of the epitaxial source/drain region are disposed above the first faceted surfaces of the epitaxial LDD region, and the first faceted surfaces of the epitaxial LDD region are disposed above the top surface of the fin.

16. A structure comprising:
a semiconductor fin on a substrate;
a gate structure on a channel region of the semiconductor fin;
a first spacer extending along a sidewall of the gate structure;
a raised epitaxial lightly doped source/drain (LDD) region on the semiconductor fin, the raised epitaxial LDD region disposed between the first spacer and the semiconductor fin, the raise epitaxial LDD region extending from the semiconductor fin in at least three distinct directions orthogonal to respective surfaces of the semiconductor fin;
a mask layer adjoining the raised epitaxial LDD region and extending from the raised epitaxial LDD region along a sidewall of the semiconductor fin; and
a source/drain region in the semiconductor fin proximate the raised epitaxial LDD region.

17. The structure of claim 16, wherein the raised epitaxial LDD region comprises a (111) facet.

18. The structure of claim 16, wherein the raised epitaxial LDD region is conformal to the semiconductor fin.

19. The structure of claim 16, wherein the source/drain region comprises a raised epitaxial source/drain region in a recess of the semiconductor fin and extending beyond a surface of the semiconductor fin.

20. The structure of claim 16 further comprising:
a second spacer disposed between the gate structure and the first spacer, the raised epitaxial LDD region laterally adjoining the second spacer.

* * * * *